United States Patent [19]

Hegenbarth et al.

[11] Patent Number: 5,772,755
[45] Date of Patent: Jun. 30, 1998

[54] ORIENTED CRYSTALLINE MATERIALS

[75] Inventors: Jack Hegenbarth, Wilmington, Del.; Diane R. Carpenter, West Chester, Pa.

[73] Assignee: W. L. Gore & Associates, Inc., Newark, Del.

[21] Appl. No.: 690,151

[22] Filed: Aug. 1, 1996

[51] Int. Cl.⁶ ......................................................... C30B 7/00
[52] U.S. Cl. .............................. 117/68; 117/925; 117/927; 117/919
[58] Field of Search ..................................... 117/919, 925, 117/927, 68

[56] References Cited

U.S. PATENT DOCUMENTS 5,036,551  8/1991  Dailey ........................................... 2/167
5,180,470  1/1993  Smith et al. ............................. 117/919

*Primary Examiner*—Robert Kunemund
*Assistant Examiner*—Evelyn Defilló
*Attorney, Agent, or Firm*—Gary A. Samuels

[57] ABSTRACT

Oriented materials are described in which particular crystalline materials are grown on a highly-oriented polytetrafluoroethylene substrate. Compositions are provided comprising a layer of aligned molecular chains of oriented polytetrafluoroethylene and an overlayer of a second polymer that imparts desired properties to the construction. A third layer of crystallizable, orientable material is then deposited on the overlayer. The third layer becomes oriented. The materials are useful as polarizers when the third layer is a polarizing dye.

5 Claims, No Drawings

ORIENTED CRYSTALLINE MATERIALS

FIELD OF THE INVENTION

This invention relates to highly-oriented materials and to improved processes for nucleation and growth thereof.

BACKGROUND OF THE INVENTION

The formation of highly-oriented structures, such as single crystals, single-domain liquid crystals, or uniaxially oriented crystallites is of major technological importance for many applications that range from reinforcing materials to electronic displays.

Small molecules are frequently processed into oriented structures by a technique known as epitaxial crystallization onto single-crystalline substrates. Examples of substrates commonly used for epitaxial growth are quartz, muskovit, alkalihalides, and salts of aromatic organic acids.

The use of some moderately oriented, semi-crystalline polymers as substrates for epitaxial growth of a few materials is described by Petermann and Broza (J. Petermann and G. Broza, J. Mater, Sci, 22, 1108 (1987)), who employed moderately oriented polyethylene, isotactic polypropylene, poly(butene-1), and isotactic polystyrene as substrates for epitaxial crystallization of several metals. Although some success was reported for a few species, such as Sn, Te, and Bi, the phenomenon certainly was not general, and no effects were observed with Zn, Au, Ni, Co, Ge, Sb. No epitaxial effects were observed with poly(vinylidene fluoride).

More recently in U.S. Pat. No. 5,180,470, it is disclosed that highly-oriented polytetrafluoroethylene having an orientation angle of less than 20° can be an effective substrate for the formation of macroscopically oriented structures of a wide variety of materials. Indeed, in the patent it is demonstrated that various organic materials, such as adipic acid, anthraquinone, and 5-chlorophenol; inorganic materials, such as thallium chloride; polymers, such as polyethylene, nylon 6, and polyvinylidenefluoride; and liquid crystals, such as 4-cyano-4'-octanebiphenyl, and 4-cyano4'-dodecanebiphenyl, can be obtained in oriented form when deposited onto the polytetrafluoroethylene substrate from the melt, solution or vapor phase.

However, it is difficult to orient some organic materials on the oriented polytetrafluoroethylene (PTFE hereinafter) substrate because of the nature of the PTFE. For example, PTFE is hydrophobic and it is difficult to orient hydrophilic materials onto it. In addition, PTFE is a relatively soft polymer and easily abraded, which limits end-use applicability in some instances.

It would be advantageous to impart certain properties to the final oriented structure which are currently difficult to impart due to the nature of the PTFE orienting layer.

SUMMARY OF THE INVENTION

It has now been found that the oriented polytetrafluoroethylene (PTFE) substrate can be provided with an overlayer material having a desired property that is imparted to the resulting structure, and then a further oriented layer of a desired material provided as a top layer. In other words, the effectiveness of the oriented polytetrafluoroethylene (PTFE) substrate as an orientation-inducing substrate is not decreased by the presence of the overlayer material. This can be of practical value when orienting layers of specific physical or chemical properties that are desired and that are different from the physical or chemical properties of PTFE.

For example, a polyimide overlayer can be provided covering the oriented PTFE substrate layer to impart durability and hardness to the composite structure and then liquid crystals can be epitaxially deposited on the overlayer material.

Likewise, a hydrophilic overlayer material can be provided covering the oriented PTFE substrate layer to impart hydrophilic properties to the composite structure and then hydrophilic liquid or non-wettable crystals such as dichroic dyes, can be epitaxially deposited on the overlayer from aqueous or alcohol solution.

DETAILED DESCRIPTION OF THE INVENTION

Thus, the invention provides for coating a highly-oriented PTFE layer that is on a substrate with an overlayer and then epitaxially covering the overlayer with still other materials. The oriented PTFE is a layer of aligned molecular polymer chains.

The invention is based on the fact that the oriented PTFE structures, prepared according to U.S. Pat. No. 5,180,470, incorporated herein by reference, facilitate crystal nucleation and formation of highly-oriented crystallites or liquid crystals. What is surprising in the invention herein is that by placing an overlayer over the aligned PTFE chains to alter the chemical and physical properties of the layered composite, still additional layers of oriented crystallites or liquid crystals can be formed over the overlayer. In other words, the presence of the overlayer does not eliminate the good orienting ability of the aligned PTFE chains.

As a first step in obtaining the structures of the invention a suitable substrate is coated with PTFE in a manner which results in the PTFE polymer chains being aligned with respect to one another.

While unoriented PTFE itself may be the substrate, suitable substrates include virtually any flat, smooth surface, such as glass, quartz, polymers, and the like. The surface can be cleaned if desired.

The substrate is coated with a thin film of oriented PTFE. As described in U.S. Pat. No. 5,180,470, PTFE is compression molded into a solid structure such as a pellet, bar, ingot, rod, stick or the like. It is then pressed against and along the substrate in a smooth motion while applying a moderate force. This leaves a thin film (e.g. 5–50 nm thick) of a highly-oriented film of PTFE. Alternatively, PTFE in powder form can be spread on the substrate with a spreading knife using a smooth motion and a moderate force. In still another method, a dispersion of PTFE can be uniformly spread in a chain-orienting manner on the substrate.

In a preferred mode, a bar of compression molded PTFE is dragged across a glass substrate so as to lay down a thin layer of oriented PTFE on the substrate.

The treated substrate is then coated with a thin overlayer of the overlayer material. Most conveniently, the overlayer is applied by painting, spraying or dipping the treated substrate with a solution of the overlayer material.

For example, in the case of an overlayer of a hydrophilic polymer, the polymer can conveniently be applied from an aqueous or organic solution, simply by dipping the treated substrate in the solution in a manner that leaves a thin layer of the overlayer material on the treated substrate.

A wide variety of hydrophilic polymers can be used as the overlayer. For example, the polymer may be a copolymer of a fluorine-containing ethylenically unsaturated monomer and a non-fluorinated vinyl monomer containing a hydrophilic group. It may be made by copolymerizing the monomers.

Preferably the fluorine-containing monomer of the fluorine-containing copolymer will be a vinyl monomer such as, for example, tetrafluoroethylene, vinyl fluoride, vinylidene fluoride, monochloro-trifluoroethylene, dichlorodifluoroethylene, hexafluoropropylene, and the like.

More preferably, the fluorine-containing vinyl monomer can be described as

CXY=CFZ wherein Z can be fluorine or hydrogen and X and Y can each be selected from hydrogen, fluorine, chlorine and —CF$_3$.

Other desirable fluorine-containing monomers useful herein include:

CH$_2$=CR
   COORf
CH$_2$=CR
   OCORf
CH$_2$=CR
   O=C—Rf
CH$_2$=CR
   O—Rf
CH$_2$=CR
   CONHRf

In the above formulae, R is hydrogen, fluorine, a methyl group, an ethyl group, a trifluoroethyl group ((CF$_3$), or pentafluoroethyl (C$_2$F$_5$). Rf is a perfluoroalkyl group with four to 21 carbons.

Meanwhile, examples of monomers that contain hydrophilic groups include those that have hydroxyl groups, carboxyl groups, sulfone groups, phosphoric acid groups, amide groups that may be N-substituted, and amino groups that may be N-substituted. Monomers in which an alkylene oxide such as ethylene oxide or propylene oxide has been subjected to an additional reaction with the active hydrogen in these groups are also favorable. Those that yield copolymers containing hydrophilic groups by performing first copolymerization and then hydrolysis, such as vinyl acetate, are also used.

Specific examples of these hydrophilic monomers include vinyl alcohol, acrylic acid, methacrylic acid, and other such unsaturated carboxylic acids, as well as alkylene oxide adducts of acrylic acid or methacrylic acid, such as those shown below.

CH$_2$=CR
   COO(C$_2$H$_4$O)nH
CH$_2$=CR
   COO(C$_3$H$_6$O)nH
CH$_2$=CR
   COO(C$_3$H$_6$O)m(CF$_2$H$_4$O)nH
CH$_2$=CR
   CONH(CH$_2$)$_3$NH$_2$

In the above formulae, R is hydrogen or a methyl group and n and m are integers greater than or equal to one and preferably one to twenty.

Both the fluorine-containing monomer and the monomer containing hydrophilic groups may be used singly or in combinations of two or more types. And if needed, other vinyl monomers, such as alkyl esters or acrylic acid or methacrylic acid, esters of trimethylol propane or other such polyhydric alcohol and acrylic acid or methacrylic acid, and the like can also be used jointly with the above-mentioned fluorine-containing monomer and the monomer containing hydrophilic groups.

The copolymer of vinyl alcohol with the fluorine-containing monomer may be prepared by saponifying a copolymer of vinyl acetate with the fluorine-containing monomer to thereby convert the acetate group contained in the copolymer into the hydroxyl group. In this case, all of the acetate groups contained in the copolymer are not necessarily replaced by the hydroxyl group and the conversion of the acetate groups into the hydroxyl groups may be carried out to the extent needed to provide the copolymer with hydrophilic properties.

The fluorine content of the fluorine-containing hydrophilic copolymer to be used in the present invention may range usually from 2% to 60%, preferably from 10% to 60%, and most preferably 20%–60% on a weight basis. If the fluorine content of the fluorine-containing hydrophilic copolymer becomes too high, on the one hand, the hydrophilic properties of the polymer may be lessened, though the heat resistance becomes better. If the fluorine content becomes too low, on the other hand, adhesion of the fluorine-containing hydrophilic polymer to the porous fluoropolymer membrane may be reduced and the heat resistance may be decreased.

The equivalent weight is the formula weight divided by the number of functional units in the formula and will be generally between 45 and 700, preferably, 60–500 and most preferably, 60–450.

If the equivalent weight is lower than 45, the water solubility of the fluorine-containing hydrophilic copolymer may be too high and the fluorine-containing copolymer will elute away with water; and if the equivalent weight is higher than 700, the hydrophilic properties will be lessened, but the interaction between the copolymer and the porous membrane will be increased and thus the copolymer will not tend to elute away.

The following Table provides the mole % fluorine monomer units in the copolymer, the fluorine weight % (F-wt %) and the equivalent weight (EqW) for a number of copolymers (where VOH is vinyl alcohol):

| Copolymer | Molar Ratio in Copolymer | | Mole % of F-monomer Units in copolymer | F-wt % | Eq-W |
|---|---|---|---|---|---|
| (CF$_2$ = CF$_2$)$_x$/ (VOH)$_y$ | x = 1, | y = 40 | 2.4 | 4.2 | 45.5 |
| | 1, | 30 | 3.2 | 5.5 | 46.4 |
| | 1, | 20 | 4.8 | 7.9 | 48.0 |
| | 1, | 10 | 9.1 | 14.3 | 53 |
| | 1, | 4 | 20 | 27.5 | 68 |
| | 1, | 1 | 50 | 53.1 | 143 |
| | 10, | 1 | 91 | 72.8 | 1043 |
| (CF$_2$ = CH$_2$)$_x$/ (VOH)$_y$ | x = 1, | y = 40 | 2.4 | 2.1 | 44.6 |
| | 1, | 30 | 3.2 | 2.8 | 45.2 |
| | 1, | 20 | 4.8 | 4.1 | 46.2 |
| | 1, | 10 | 9.1 | 7.5 | 49 |
| | 1, | 4 | 20 | — | — |
| | 1, | 1 | 50 | 33.6 | 107 |
| | 10, | 1 | 91 | 55.6 | 683 |
| (CFH = CH$_2$)$_x$/ (VOH)$_y$ | x = 1, | y = 40 | 2.4 | 1.1 | 44.2 |
| | 1, | 30 | 3.2 | 1.4 | 44.6 |
| | 1, | 20 | 4.8 | 2.1 | 45.3 |
| | 1, | 10 | 9.1 | 4.0 | 47.6 |
| | 1, | 4 | 20 | — | — |
| | 1, | 1 | 50 | 21.3 | 89 |
| | 10, | 1 | 91 | 37.8 | 503 |
| (CF$_2$ = CFCl)$_x$/ (VOH)$_y$ | x = 1, | y = 40 | 2.4 | 3.1 | 46.0 |
| | 1, | 30 | 3.2 | 4.0 | 46.9 |
| | 1, | 20 | 4.8 | 5.8 | 48.9 |
| | 1, | 10 | 9.1 | 10.4 | 54.6 |
| | 1, | 4 | 20 | — | — |
| | 1, | 1 | 50 | 35.8 | 159 |
| | 10, | 1 | 91 | 47.2 | 1208 |
| (CF$_2$ = CCl$_2$)$_x$/ (VOH)$_y$ | x = 1, | y = 40 | 2.4 | 2.0 | 46.5 |
| | 1, | 30 | 3.2 | 2.7 | 47.7 |

-continued

| Copolymer | Molar Ratio in Copolymer | Mole % of F-monomer Units in copolymer | F-wt % | Eq-W |
|---|---|---|---|---|
| | 1, 20 | 4.8 | 3.8 | 50.0 |
| | 1, 10 | 9.1 | 6.7 | 57 |
| | 1, 4 | 20 | — | — |
| | 1, 1 | 50 | 20.8 | 183 |
| | 10, 1 | 91 | 26.3 | 1442 |
| $(CF_2 = CFCF_3)_x/$ $(VOH)_y$ | x = 1, y = 40 | 2.4 | 6.1 | 46.8 |
| | 1, 30 | 3.2 | 7.9 | 48.0 |
| | 1, 20 | 4.8 | 11.3 | 50.5 |
| | 1, 10 | 9.1 | 19.6 | 58 |
| | 1, 4 | 20 | — | — |
| | 1, 1 | 50 | 59.0 | 193 |
| | 10, 1 | 91 | 73.9 | 1543 |

The porous fluoropolymer membrane coated with the hydrophilic fluorine-containing copolymer may be prepared, for example, by dissolving the hydrophilic fluorine-containing copolymer in an organic solvent such as, for example, an alcohol, ketone, ester, amide or hydrocarbon, and immersing the porous fluoropolymer membrane in the resulting solution; or impregnating the membrane with the resulting solution by spraying the membrane with the resulting solution; or by coating the former with the latter by means of rolls, and drying the resulting product.

To prepare an overlayer of a polyimide, it is most convenient to apply an overlayer of a polyamic acid to the treated substrate by painting, spraying, or dipping. A polyamic acid of methylene dianiline and benzophenone dianhydride in a solvent of n-methyl pyrollidone and xylene is available from the DuPont Company. By heating the resulting composite, the polyamic acid is converted to polyimide.

The resulting overlaid layered composite can then be used to further deposit a wide variety of oriented materials by chemical or vapor deposition, or melt-or solution-crystallization. In particular, vapor or solvent deposition of crystallizable material or liquid crystal forming material can be carried out. These materials align their molecules along the alignment of the underlying PTFE aligned chains of molecules. Representative suitable crystallizable and orientable materials for enhanced nucleation and orientation include polymers, oligomers, smaller organic molecules, metals, alloys of metals, ceramics, ceramic precensors, etc. These materials can be deposited by a wide variety of methods. Specifically, suitable materials can be deposited by crystallization from the melt or from solution. Alternatively, the crystallizable materials can be deposited from their vapors, or through any form of chemical vapor deposition, or decomposition. In yet another method, the suitable materials can be formed onto the oriented poly(tetrafluoroethylene) through epitaxial synthesis, or methathesis. In still another application of the present invention, polymerizable monomers, are deposited onto the oriented poly(tetrafluoroethylene), which are subsequently polymerized.

The temperature at which contacting in any form of the crystallizable material with the ultra-oriented polymer structure is executed is not critical, provided that the temperature is below the melting or decomposition temperature of the oriented poly(tetrafluoroethylene) structure and the overlayer.

It is surprising that highly-oriented structures can be obtained despite the presence of the overlayer between the oriented PTFE layer and the orientable upper material.

The orientation of the oriented PTFE need not be uniaxial. Specific patterns, such as waved, concentric, or cross-hatch can be employed.

The oriented structures of the present invention have many applications that will be dictated by the intrinsic physico/chemical properties of the materials. For example, the induction of nucleation and oriented crystal growth of a wide variety of substances is of great use for many opto/electronic materials and devices.

The following examples are provided for illustrative purposes only, and are not intended to limit the scope of the present invention, which is defined in the appended claims.

Example 1

Coating of the Highly-Oriented PTFE Layer With Polyamic Acid of Methylene Dianaline (MDA) and Benzophenone Dianhydride (BPDA)

The polyamic acid of MDA and BPDA (18.5% solids) in n-methyl pyrollidone (NMP) and xylene was obtained from the Dupont Company. This material was identified as RC 5060 Pyre—M.L. wire enamel. Three stock solutions were made from the 18.5% solution as follows:

A. 1.6 ml of 18.5% solution in 128 g Xylene and 205 g NMP

B. 3.2 ml of 18.5% solution in 128 g Xylene and 205 g NMP

C. 12.8 ml of 18.5% solution in 128 g Xylene and 205 g NMP

Glass plates about 6 ×8 inches (15.2 –20.3 cm) were coated to produce oriented PTFE. Specifically, the glass plate was placed on a platform and heated by radiant heat to a temperature of 200° C. A tape of PTFE was prepared by lubrication (paste) extrusion of coagulated dispersion type PTFE, evaporating the lubricate and stretching the extruded tape at 2:1 to make the tape compliant. This tape was wrapped around a heatable bar about 14 inches long. The wrapped bar was then heated to about 300° C. and then the bar dragged over the glass substrate with adjustable force. Multiple passes were made to ensure complete coverage of the glass surface. By dragging the PTFE bar, PTFE is deposited on the surface of the glass in aligned rows of PTFE chains.

Glass samples were dip coated in a polyamic acid stock solution. The coating process consisted of a 30 second soak in the solution A, B or C, followed by a constant rate of withdrawal as shown in Table 1. The samples were allowed to dry at room temperature overnight. The samples were then heated in a air recirculating oven at 250° C. for two hours to convert the polyamic acid to an overlayer of polyimide.

A glass specimen without the oriented PTFE layer was included as a control.

The samples were then coated with dichroic dye G205 by heating the dye and depositing the vapors on the substrate in a vacuum deposition chamber. The vacuum was $8+10^{-6}$ torr.

Orientation of the deposited dye on the overlayer surface was determined by the change in absorbance/transmission using a known polarizing film. For samples labelled "yes" in Table 1, the absorbance/transmission indicated the dye was oriented to form a polarizer.

Results are given in Table 1 below.

TABLE 1

| Sample | Solution | Rate inch/min. | Direction to PTFE Orientation | PTFE Layer/ Polyimide Layer Polarized |
|---|---|---|---|---|
| 1 | A | 15 | 90° | yes/yes |
| 2 | A | 1.5 | 90° | yes/yes |
| 3 | A | 15 | 0 | yes/yes |
| 4 | A | 1.5 | 0 | yes/yes |
| 5 | B | 15 | 90° | yes/yes |
| 6 | B | 15 | 0 | yes/yes |
| 7 | B | 1.5 | 0 | yes/yes |
| 8 | B | 1.5 | 90° | yes/yes |
| 9* | B | 1.5 | — | no/no |
| 10 | C | 15 | 90° | yes/yes |
| 11 | C | 1.5 | 90° | yes/yes |
| 12 | C | 1.5 | 0 | yes/yes |
| 13 | C | 1.5 | 0 | yes/yes |

*Sample 9 was clear glass. No PTFE was on it.

Example 2

Experiments like those in Example 1 were carried out with 1.5%, 3% and 6% polyamic solution in Xylene and NMP.

| Solution % | Rate inch/min | Direction to PTFE Orientation | PTFE Layer Polyamide Layer Polarizer |
|---|---|---|---|
| 1.5 | 15 | 0 | yes/yes |
| 3 | 15 | 0 | yes/yes |
| 6 | 15 | 0 | yes/yes |

Example 3
Coatings of Highly-Oriented PTFE Layer With Hydrophilic Polymer Overlayer
A. Preparation of PTFE coated substrates Glass microscope slides (from Fisher Scientific Co.) were used as substrates. The glass substrates were coated with polytetrafluoroethylene according to the method disclosed in U.S. Pat. No. 5,180,470 with an instrument that was designed for accurate and consistent deposition of thin films to result in oriented thin films. The equipment is comprised of two parts; a lower, temperature controlled, movable stage and a pivoting, temperature controlled, polytetrafluoroethylene holder. The heatable lower stage is mounted on a linear positioning stage. The speed and direction of the positioning stage are controlled by a precision micro-stepper drive system. The upper section is a counter-balanced, temperature controlled support for a polytetrafluoroethylene rod. Holders are designed to support a standard ½ inch polytetrafluoroethylene rod with its axis perpendicular to the substrate that is to be coated. Like the lower stage, the temperature of the upper section is controlled by a self-tuning temperature controller with an upper temperature limit of 400° C. The interfacial pressure between the polytetrafluoroethylene rod and the substrate is controlled by varying the weights loaded onto the upper section generating approximately 2.5 MPa pressure. Standard grade polytetrafluoroethylene was employed. The polytetrafluoroethylene was deposited onto the glass slides at temperatures in the range between 250° and 300° C. at a rate of 1 millimeter per second.

B. Deposition of hydrophilic polymer 0.1% and 0.01% solution of a hydrophilic copolymer were prepared in a 50/50 wt. ratio of ethyl alcohol and methyl alcohol. PTFE coated glass from Part A was dipped into each of the solutions for a few seconds at room temperature and withdrawn and dried. The copolymer was a copolymer of tetrafluoroethylene and vinyl alcohol.

C. Deposition of crystalline compounds

The hydrophilized polytetrafluoroethylene glass substrates of Part B were coated with water-soluble crystalline compounds by applying the compound from solution by pillette. The crystalline compound was polycaprolactone in chloroform in an amount of 1 wt. percent, and was applied by dragging the pipette across the surface. Subsequently, the samples were air dried at room temperature, removed from the chamber, and examined in a polarzing optical microscope.

Degree of orientation

Orientation was established by visual inspection under cross-polarizers.

Examination in the polarized optical microscope of the films revealed that all samples were birefringent and were crystalline; good orientation was observed along the direction in which the polytetrafluoroethylene coating was deposited.

We claim:

1. A multi-layer composite having as a first layer an oriented PTFE layer on a substrate; a second layer of a hydrophilic polymer adjacent and abutting the oriented PTFE of the first layer and providing a covering over the oriented PTFE; a third layer adjacent and abutting the second layer, said third layer being formed from a crystallizable and orientable material, said hydrophilic polymer being a copolymer of tetrafluoroethylene and a hydrophilic comonomer.

2. The composite of claim 1 wherein the hydrophilic comonomer is vinyl alcohol or vinyl acetate.

3. The composite of claim 1 wherein the second layer is a polyimide.

4. Process for aligning molecules of a crystalline material along an oriented polytetrafluoroethylene film, which comprises forming a highly-oriented polytetrafluoroethylene substrate in which the polytetrafluoroethylene molecules are oriented substantially parallel to one another, contacting said oriented polytetrafluoroethylene substrate with a that is a polyimide to produce a thin film of the polymer on said polytetrafluoroethylene substrate, contacting said film-covered substrate with an crystallizable, orientable organic material whereby the organic material forms on the coating and substantially aligns one of its crystallographic axes parallel to the polytetrafluoroethylene molecules.

5. The process of claim 4 wherein the second polymer is a hydrophilic polymer.

* * * * *